United States Patent
Wang et al.

(10) Patent No.: US 9,672,309 B2
(45) Date of Patent: Jun. 6, 2017

(54) METHOD FOR GENERATING LAYOUT PATTERN

(71) Applicant: UNITED MICROELECTRONICS CORP., Hsin-Chu (TW)

(72) Inventors: Harn-Jiunn Wang, Kaohsiung (TW); Teng-Yao Chang, Kaohsiung (TW); Chin-Lung Lin, Hsinchu (TW); Chih-Hsien Tang, Taipei (TW); Yao-Jen Fan, Chiayi (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 227 days.

(21) Appl. No.: 14/696,498

(22) Filed: Apr. 27, 2015

(65) Prior Publication Data
US 2016/0275226 A1     Sep. 22, 2016

(30) Foreign Application Priority Data

Mar. 18, 2015   (CN) .......................... 2015 1 0118314

(51) Int. Cl.
*G06F 17/50*     (2006.01)
*H01L 29/66*     (2006.01)

(52) U.S. Cl.
CPC ...... *G06F 17/5068* (2013.01); *H01L 29/6681* (2013.01); *H01L 29/66795* (2013.01)

(58) Field of Classification Search
CPC .......... G06F 17/5068; H01L 29/66795; H01L 29/6681
USPC ........................................................ 716/55
See application file for complete search history.

(56) References Cited

U.S. PATENT DOCUMENTS 8,533,651 B1 * 9/2013 Tan ..................... G06F 17/5072
                                                         716/103
2015/0052491 A1  2/2015 Tsao

* cited by examiner

*Primary Examiner* — Jack Chiang
*Assistant Examiner* — Brandon Bowers
(74) *Attorney, Agent, or Firm* — Winston Hsu; Scott Margo

(57) ABSTRACT

A method for generating a layout pattern includes following steps. A basic layout pattern including a plurality of first stripe patterns in a first cluster region is provided. Each first stripe pattern extends in a first direction, and the first stripe patterns have equal pitches in a second direction. A plurality of anchor bar patterns are generated. Each anchor bar pattern extends in the first direction, and the anchor bar patterns have equal pitches in the second direction. Edges of at least one of the anchor bar patterns in the second direction are aligned with edges of two adjacent first stripe patterns respectively. At least one of the anchor bar patterns overlaps a first space between two adjacent first stripe patterns. At least one first mandrel pattern is generated at the first space overlapped by the anchor bar pattern, and the first mandrel pattern is outputted to a photomask.

18 Claims, 13 Drawing Sheets

METHOD FOR GENERATING LAYOUT PATTERN

BACKGROUND OF THE INVENTION

1. Field of the Invention

The present invention relates to a method for generating a layout pattern, and more particularly, to a method for generating a layout pattern including mandrel patterns by using anchor bar patterns.

2. Description of the Prior Art

As the size of the field effect transistors (FETs) becomes smaller continuously, the conventional planar field effect transistor has difficulty in development because of the manufacturing limitations. Therefore, for overcoming the manufacturing limitations, the non-planar transistor technology such as Fin Field effect transistor (FinFET) technology is developed to replace the planar FET and becomes a development trend in the related industries.

Generally, patterned structures such as fin structures in the FinFET may be manufactured by a sidewall image transfer (SIT) technology through the following processes. First, a layout pattern including patterned structures to be formed is inputted into a computer system and is modified through suitable calculation for generating corresponding mandrel patterns. The mandrel patterns are then defined in a mask, and patterned structures manufactured by the SIT technology may be obtained by performing photolithography processes with the mask and corresponding etching processes. However, the layout patterns of the fin structures in each cluster regions generally have to modified through calculations separately for generating required mandrel patterns because the fin structures in each of the cluster regions on a chip maybe not designed to be aligned with one another (generally called as "not on global grid"), and the required calculation time is increased accordingly. For handling more complicated patterned structures, an improved method for generating the layout pattern is demanded for accelerating the process and calculation time.

SUMMARY OF THE INVENTION

It is one of the objectives of the present invention to provide method for generating a layout pattern. Anchor bar patterns are employed to for mandrel patterns, and the purposes of simplifying the calculation process and accelerating the handling speed may be achieved accordingly.

A method for generating a layout pattern is provided in an embodiment of the present invention. The method includes following steps. First, a basic layout pattern is provided to a computer system. The basic layout pattern includes a plurality of first stripe patterns in a first cluster region. Each of the first stripe patterns extends in a first direction, and the first stripe patterns have equal pitches in a second direction. A plurality of anchor bar patterns is then generated. Each of the anchor bar patterns extends in the first direction, and the anchor bar patterns have equal pitches in the second direction. Edges of at least one of the anchor bar patterns in the second direction are aligned with edges of two adjacent first stripe patterns respectively, and at least one of the anchor bar patterns overlaps a first space between two adjacent first stripe patterns. A first mandrel pattern is then generated at the first space overlapped by the anchor bar pattern, and the first mandrel pattern is outputted to a photomask.

In the method of generating the layout pattern in the present invention, the position of the mandrel pattern may be decided by using the anchor bar patterns, and stripe patterns in different cluster regions may be handled at the same time. The purposes of simplifying the calculation process and accelerating the handling speed may be achieved accordingly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
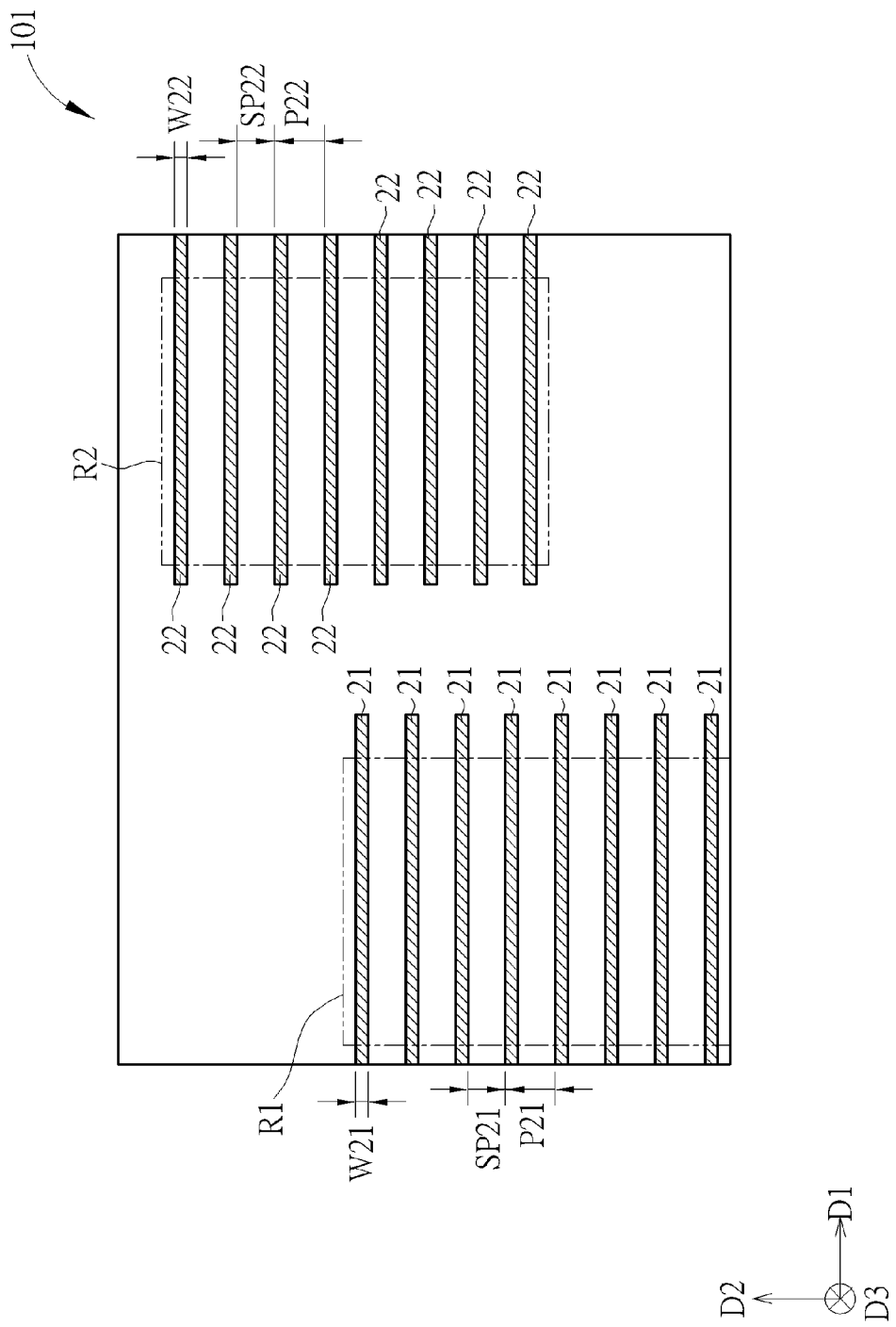
FIGS. 1-3 are schematic drawings illustrating a method for generating a layout pattern according to a first embodiment of the present invention.
Figure 2:
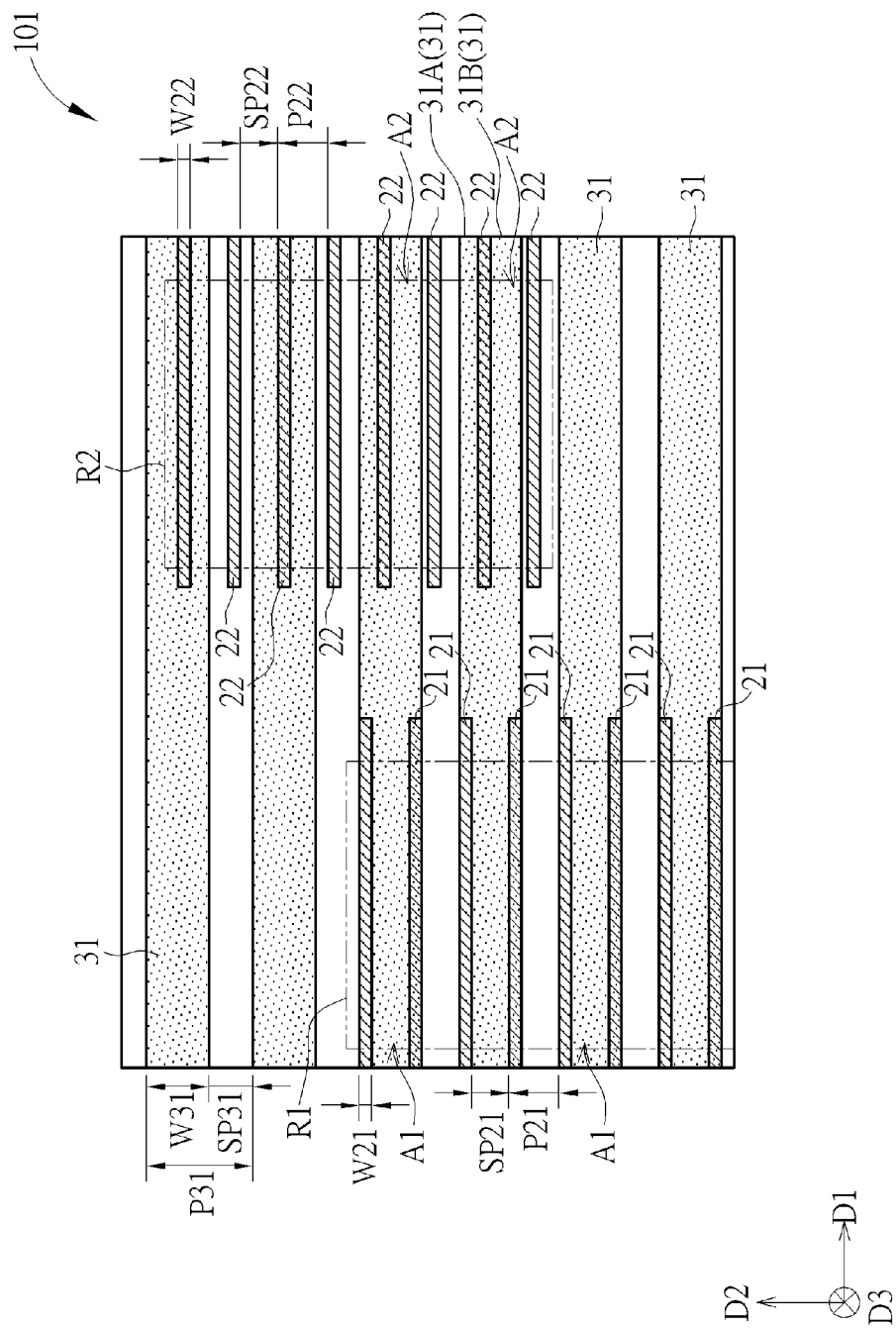
Figure 3:
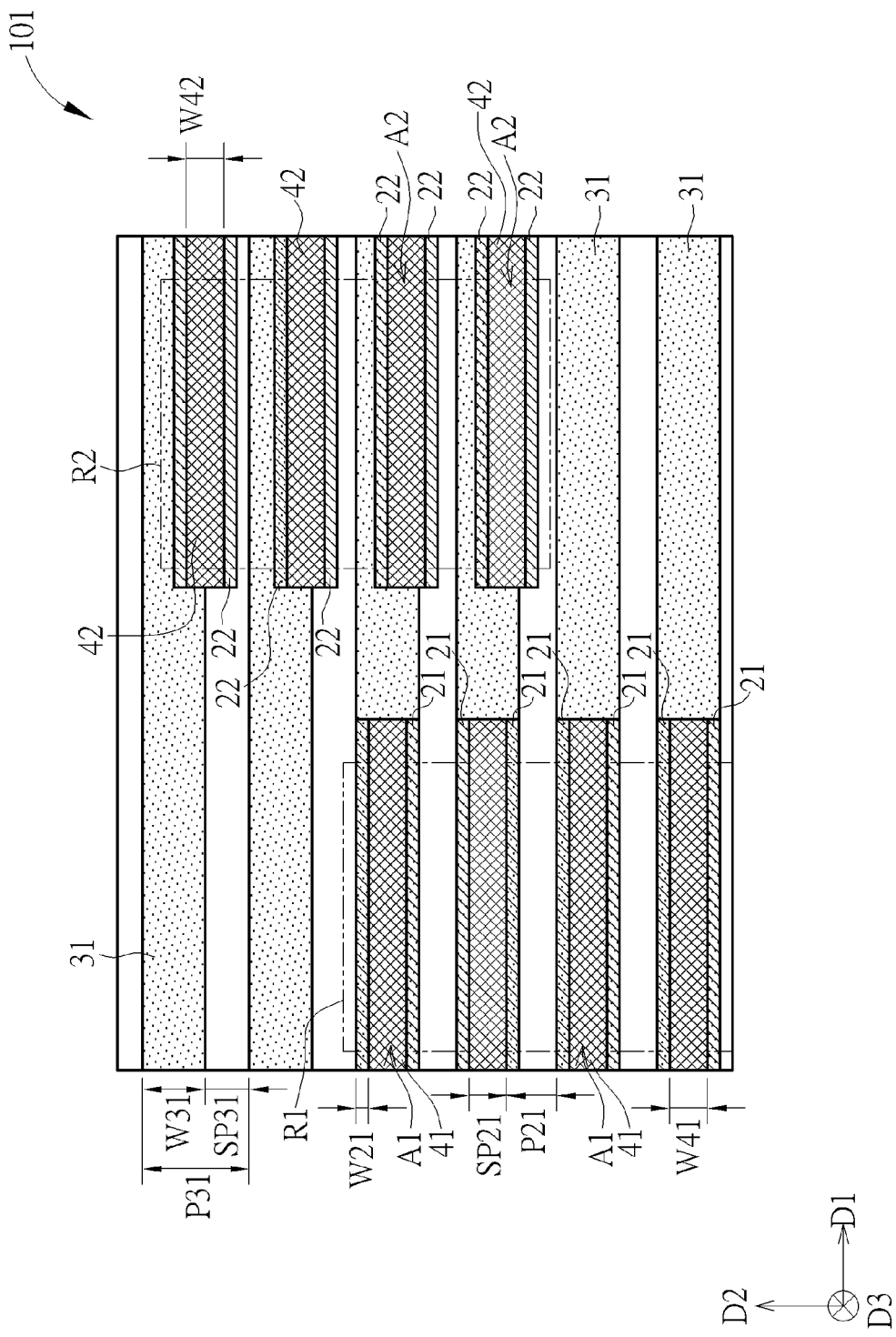
Figure 4:
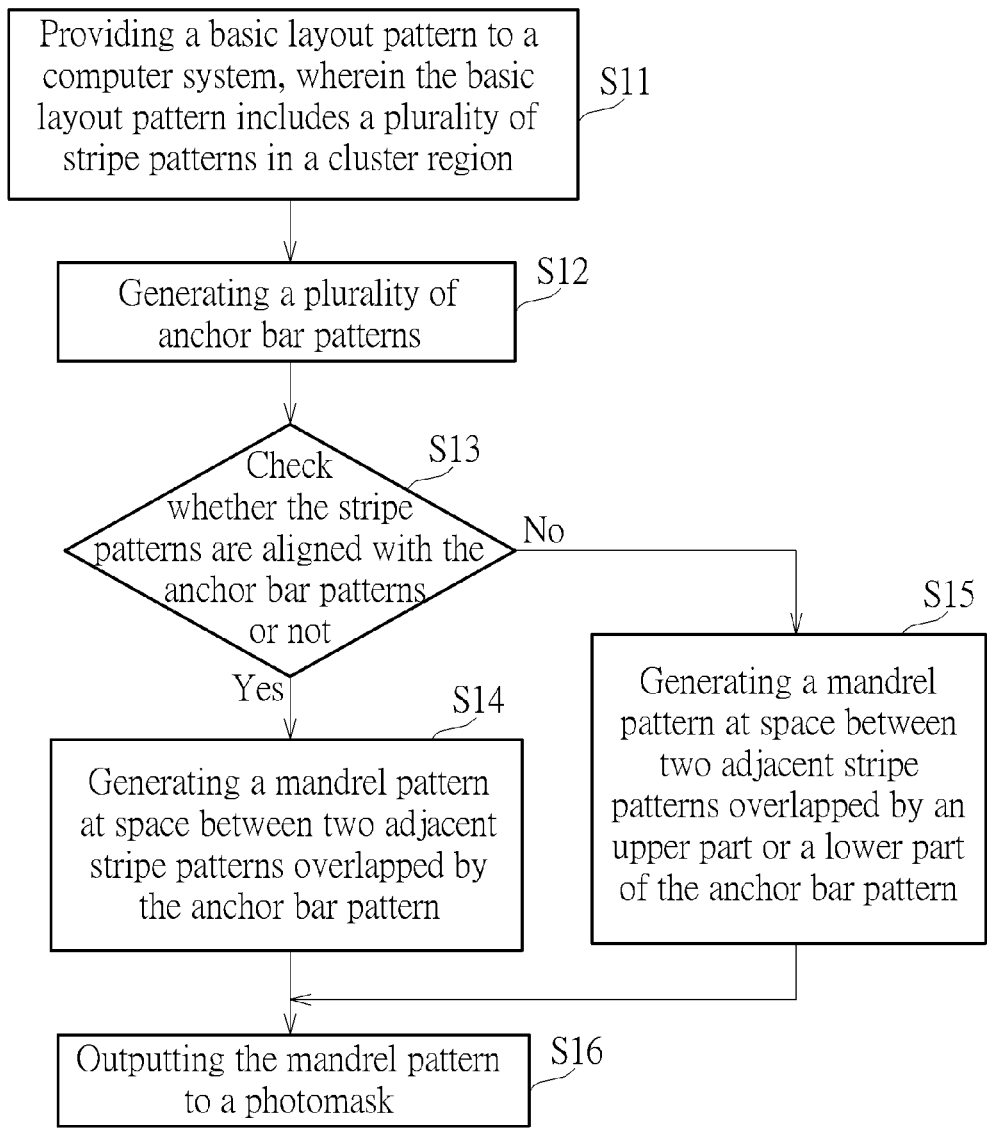
FIG. 4 is a flow chart illustrating the method for generating the layout pattern according to the first embodiment of the present invention.

Please refer to FIGS. 1-4. FIGS. 1-3 are schematic drawings illustrating a method for generating a layout pattern according to a first embodiment of the present invention. FIG. 4 is a flow chart illustrating the method for generating the layout pattern in this embodiment. The method for generating the layout pattern provided in this embodiment includes following steps. First, as shown in FIG. 1 and FIG. 4, in step S11, a basic layout pattern 101 is provided to a computer system. The basic layout pattern 101 in this embodiment includes a plurality of first stripe patterns 21 and a plurality of second stripe patterns 22, but not limited thereto. In other embodiments of the present invention, the basic layout pattern 101 may also include the first stripe patterns 21 only. The first stripe patterns 21 are at least partially disposed in a first cluster region R1, the second stripe patterns 22 are at least partially disposed in a second cluster region R2, and the first cluster region R1 is separated from the second cluster region R2, but not limited thereto. Each of the first stripe patterns 21 extends in a first direction D1, and the first stripe patterns 21 are repeatedly disposed in a second direction D2 by equal pitches. In other words, the first stripe patterns 21 have equal pitches in the second direction D2. The first direction D1 is substantially perpendicular to the second direction D2, but not limited thereto. Each of the second stripe patterns 22 extends in the first direction D1, and the second stripe patterns 22 are repeatedly disposed in the second direction D2 by equal pitches. In other words, the second stripe patterns 22 have equal pitches in the second direction D2. The second stripe patterns 22 are parallel to the first stripe patterns 21, and the second stripe patterns 22 are not aligned with the first stripe patterns 21.

Specifically, in this embodiment, widths of the first stripe patterns 21 are identical to one another, and widths of the second stripe patterns 22 are identical to one another. Spacing between two adjacent first stripe patterns 22 is equal to spacing between two adjacent second stripe patterns 22, and the width of each of the first stripe patterns 21 is equal to the width of each of the second stripe patterns 22, but not limited thereto. For example, each of the first stripe patterns 21 has a first width W21 in the second direction D2, and each of the second stripe patterns 22 has a second width W22 in the second direction D2. First spacing SP21 exists between two adjacent first stripe patterns 21, and second spacing SP22 exists between two adjacent second stripe patterns 22. The first stripe patterns 21 have a first pitch P21, and the second stripe patterns 22 have a second pitch P22. The first pitch P21 is equal to the sum of the first width W21 and the first spacing SP1, and the second pitch P22 is equal to the sum of the second width W22 and the second spacing SP2. The first width W21 is equal to the second width W22 preferably, the first spacing SP1 is equal to the second spacing SP2 preferably, and the first pitch P21 is equal to the second pitch P22 preferably, but not limited thereto. In other embodiments of the present invention, the first width W21 may be different from the second width W22 while the first pitch P21 is still equal to the second pitch P22. It is worth noting that the first stripe patterns 21 and the second stripe patterns 22 in this embodiment may be used to represent positions of components subsequently formed in different regions of a semiconductor device, such as fin structures or gate electrodes, but not limited thereto. Therefore, the first stripe patterns 21 may be not aligned with the second stripe patterns 22 according to design considerations, but the present invention is not limited to this. In other embodiments of the present invention, the first stripe patterns 21 and the second stripe patterns 22 in different cluster regions may also be aligned with one another.

As shown in FIG. 2 and FIG. 4, in step S12, a plurality of anchor bar patterns 31 is then generated. Each of the anchor bar patterns 31 extends in the first direction D1, and at least a part of the anchor bar patterns 31 may extend to the first cluster region R1 or/and the second cluster region R2. Edges of at least one of the anchor bar patterns 31 in the second direction D2 are aligned with and partially overlap edges of two adjacent first stripe patterns 21 respectively. The anchor bar patterns 31 are repeatedly disposed in the second direction D2 by equal pitches (such as third pitches P31 shown in FIG. 2), and the anchor bar patterns 31 have equal pitches in the second direction D2. In this embodiment, a third width W31 of each of the anchor bar patterns 31 is equal to the sum of the first spacing SP21 between two adjacent first stripe patterns 21 and twice the first width W21 of the first stripe pattern 21. Third spacing SP31 between two adjacent anchor bar patterns 31 in the second direction D2 is equal to the first spacing SP 21 between two adjacent first stripe patterns SP21, and the third pitch P31 of the anchor bar patterns 31 is equal to twice the first pitch P21. In other words, the anchor bar patterns 31 are generated based on the positions of the first stripe patterns 21, and the anchor bar patterns 31 extend toward the first cluster region R1 with the first stripe patterns disposed therein and the second cluster region R2 with the second stripe patterns 22 disposed therein.

In addition, at least one of the anchor bar patterns 31 overlaps a first space A1 between two adjacent first stripe patterns 21 in a vertical direction D3, and at least one of the anchor bar patterns 31 overlaps a part of a second space A2 between two adjacent second stripe patterns 22 in the vertical direction D3. The anchor bar patterns 31 will not be aligned with the second stripe patterns 22 because the anchor bar patterns 31 are generated based on the first stripe patterns 21, and the second stripe patterns 22 are not aligned with the first stripe patterns 21. Therefore, the anchor bar pattern 31 will completely cover the first space A1 while the anchor bar pattern 31 overlaps the first space A1. An upper part 31A and a lower part 31B of the anchor bar pattern 31 will partially overlap different second space A2 respectively.

As shown in FIG. 2, FIG. 3, and FIG. 4, step S13 is performed to check whether the stripe pattern are aligned with the anchor bar patterns 31 or not. Step S14 is performed when the stripe pattern are aligned with the anchor bar patterns 31, and step S15 is performed when the stripe pattern are not aligned with the anchor bar patterns 31. For example, the step S14 is executed in the first cluster region R1 because the first stripe patterns 21 are aligned with the anchor bar patterns 31, and a first mandrel pattern 41 is generated at the first space Al overlapped by the anchor bar pattern 31. Comparatively, the step S15 is executed in the second cluster region R2 because the second stripe patterns 22 are not aligned with the anchor bar patterns 31, a second mandrel pattern 42 is generated at the second space A2 overlapped by the anchor bar pattern 31, and the second space A2 with the second mandrel pattern 42 generated therein overlaps one of the upper part 31A of the anchor bar pattern 31 or the lower part 31B of the anchor bar pattern 31 only. In this embodiment, each of the spaces A2 corresponding to the second mandrel patterns 42 overlaps the lower parts 31B of the anchor bar patterns 31, but not limited thereto. In other embodiments of the present invention, each of the spaces A2 corresponding to the second mandrel patterns 42 may also overlap the upper parts 31A of the anchor bar patterns 31.

Subsequently, in step S16, the mandrel patterns are outputted to a photomask. For example, the first mandrel patterns 41 and the second mandrel patterns 42 are generated by the method of this embodiment, and the first mandrel patterns 41 and the second mandrel patterns 42 may then be outputted to the same photomask or different photomasks respectively. For instance, all of the first mandrel patterns 41 may be outputted to one photomask and all of the second mandrel patterns 42 may be outputted to another photomask; or a portion of the first mandrel patterns 41 and a portion of the second mandrel patterns 42 may be outputted to one photomask while another portion of the first mandrel patterns 41 and another portion of the second mandrel patterns 42 are outputted to another photomask, but not limited thereto. In other embodiments of the present invention, only the first mandrel patterns 41 are outputted to a photomask when the basic layout pattern only includes the first stripe patterns 21 and only the first mandrel patterns 41 are generated. According to the method of generating the layout pattern in this embodiment, the first stripe patterns 21 and the second stripe patterns 22, which are disposed in different cluster regions and are not aligned with one another, may be handled at the same time by the anchor bar patterns 31 for generating the first mandrel patterns 41 and the second mandrel patterns 42. The purposes of simplifying the calculation process and accelerating the handling speed may be achieved accordingly.

In this embodiment, a fourth width W41 of the first mandrel pattern 41 in the second direction D2 is substantially equal to a fifth width W42 of the second mandrel pattern 42 in the second direction D2, and the fourth width W41 is substantially equal to the first spacing SP 21 between two adjacent first stripe patterns 21, but not limited thereto. Corresponding first mandrel structures and corresponding second mandrel structures may be directly formed on a substrate by the photomask including the first mandrel patterns 41 and the second mandrel patterns 42 generated by the method of this embodiment, sidewall spacers may be formed to surround the first mandrel structures and the second mandrel structures, and pattern structures corresponding to the first stripe patterns 21 and the second stripe patterns 22 may then be formed on the substrate by a fin cut process. The patterned structures may be used to form fin structures or gate electrodes of a semiconductor device, but not limited thereto.

Figure 5:
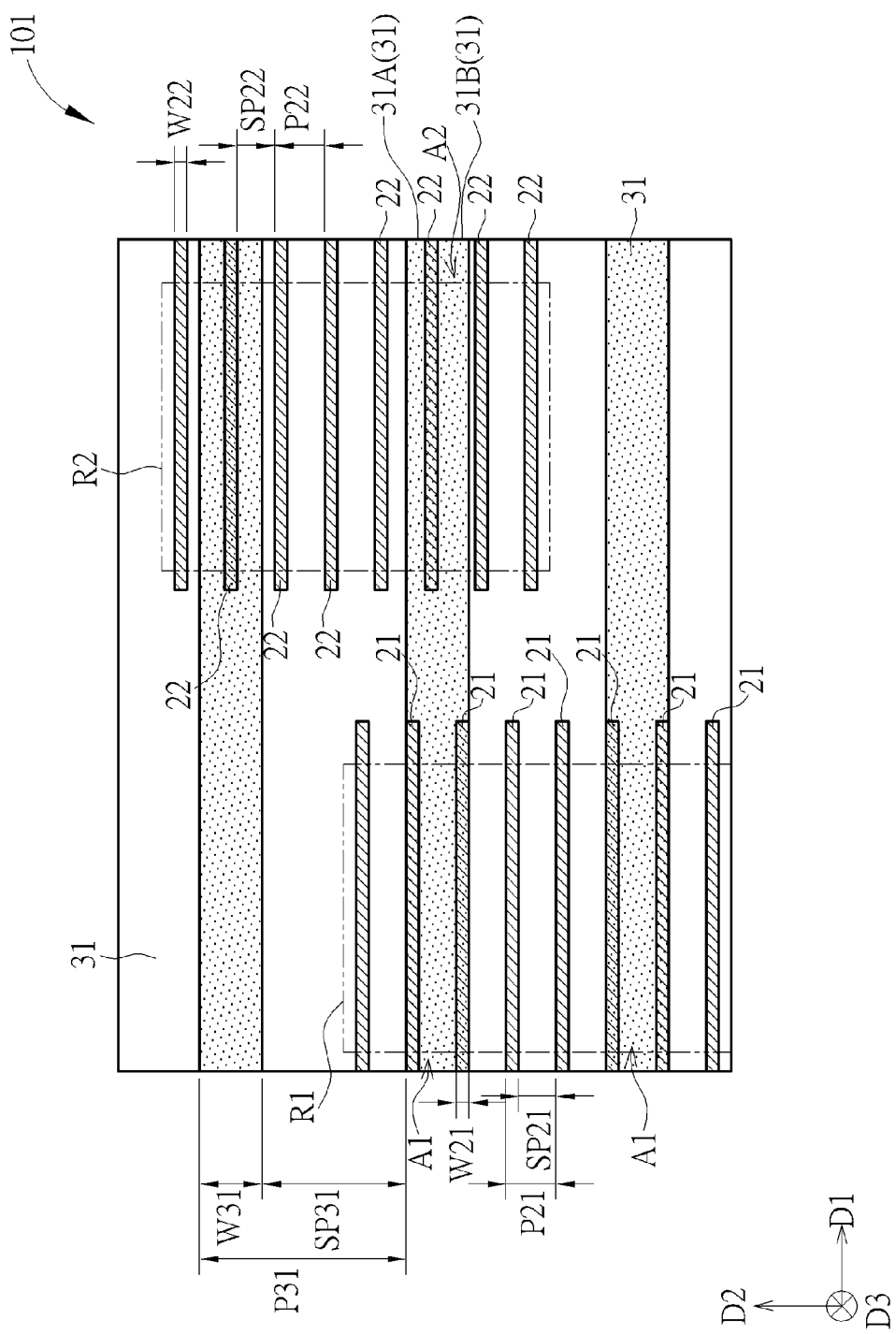
FIG. 5 and FIG. 6 are schematic drawings illustrating a method for generating a layout pattern according to a second embodiment of the present invention.
Figure 6:
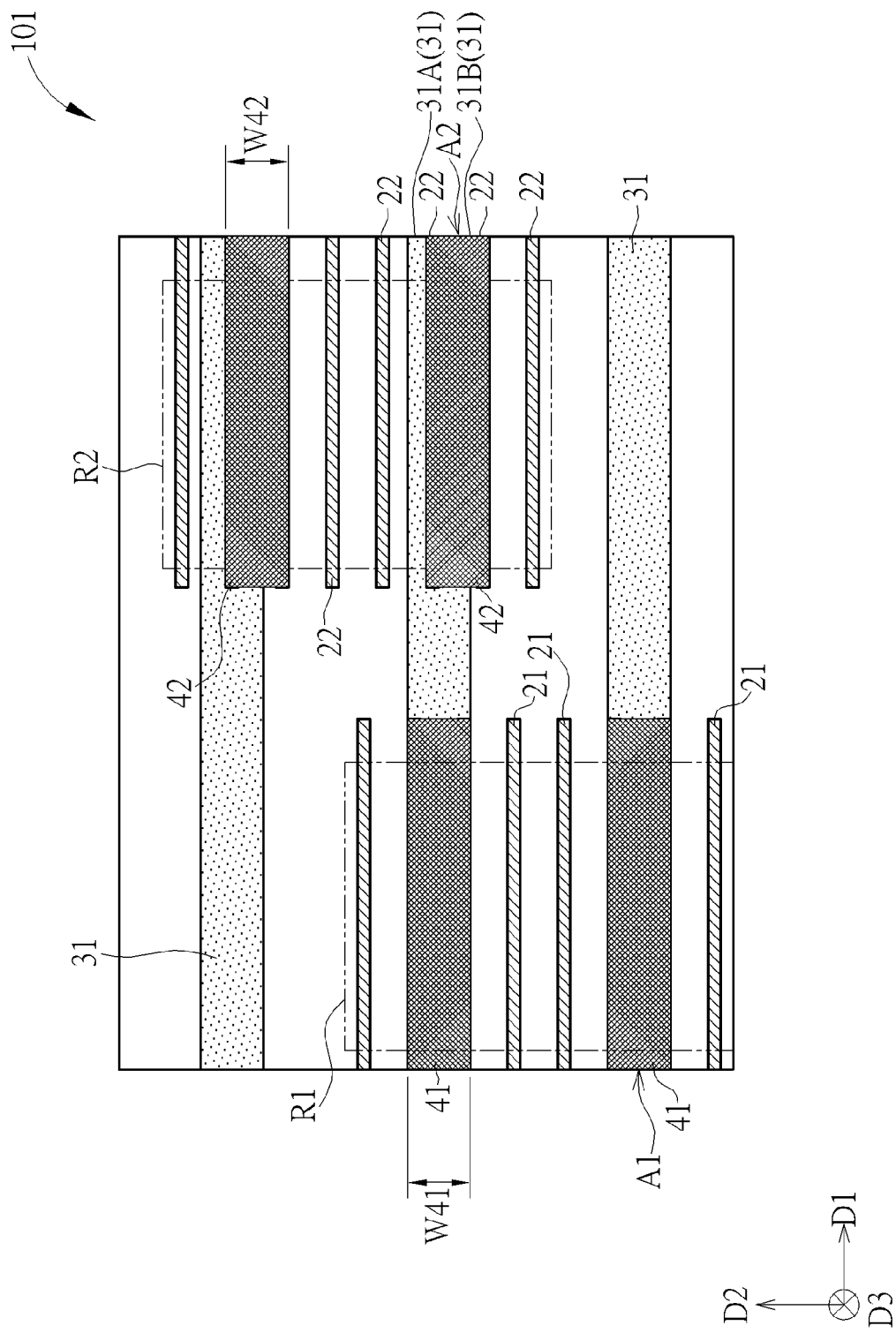

Please refer to FIG. 5 and FIG. 6. FIG. 5 and FIG. 6 are schematic drawings illustrating a method for generating a layout pattern according to a second embodiment of the present invention. As shown in FIG. 5 and FIG. 6, the differences between the method of this embodiment and the first embodiment mentioned above is that in this embodiment, the third spacing SP31 between two adjacent anchor bar patterns 31 is equal to the sum of triple the first spacing SP21 between two adjacent first stripe patterns 21 and twice the first width W21 of the first stripe pattern 21. In other words, the anchor bar patterns 31 in this embodiment are still generated based on the first stripe patterns 21, but the spacing between the anchor bar patterns 31 in this embodiment is larger relatively. Additionally, in the distributing condition of the anchor bar patterns of this embodiment, the fourth width W41 of the first mandrel pattern 41 in the second direction D2 is equal to the sum of one first pitch P21 of the first stripe patterns 21 and one first width W21 of the first stripe pattern 21, and the fifth width W42 of the second mandrel pattern 42 is substantially equal to the fourth width W41 of the first mandrel pattern 41, but not limited thereto. Corresponding first mandrel structures and corresponding second mandrel structures may be directly formed on a substrate by the photomask including the first mandrel patterns 41 and the second mandrel patterns 42 generated by the method of this embodiment, and pattern structures corresponding to the first stripe patterns 21 and the second stripe patterns 22 may then be formed on the substrate by a dual SIT technology and a fin cut process, but not limited thereto. It is worth noting that, in other embodiments of the present invention, the spacing between the anchor bar patterns 31 may be further enlarged, and the sizes of the first mandrel patterns 41 and the second mandrel patterns 42 may be modified correspondingly so as to be applied to multiple SIT technology.

Figure 7:
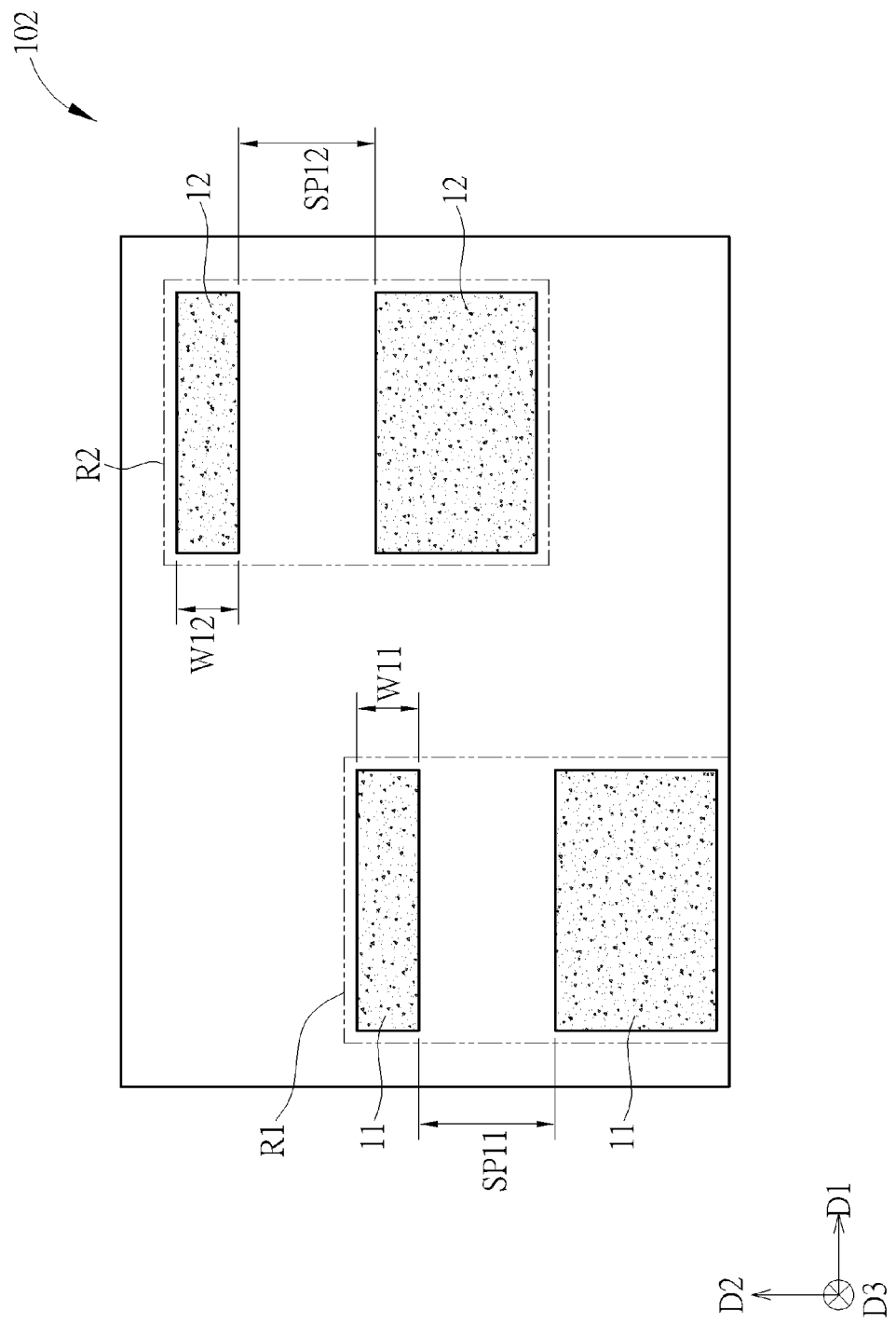
FIGS. 7-10 are schematic drawings illustrating a method for generating a layout pattern according to a third embodiment of the present invention.
Figure 9:
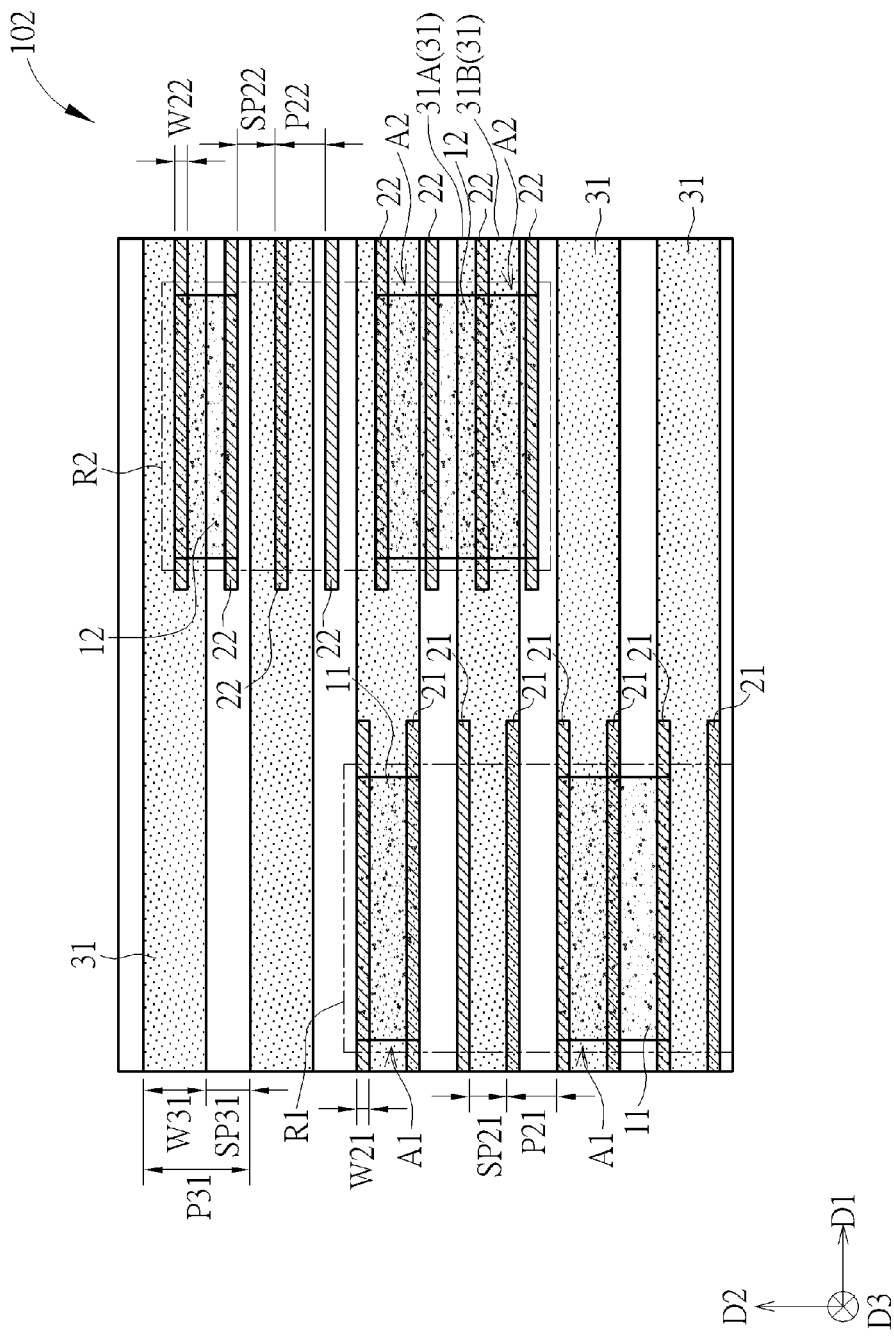
Figure 10:
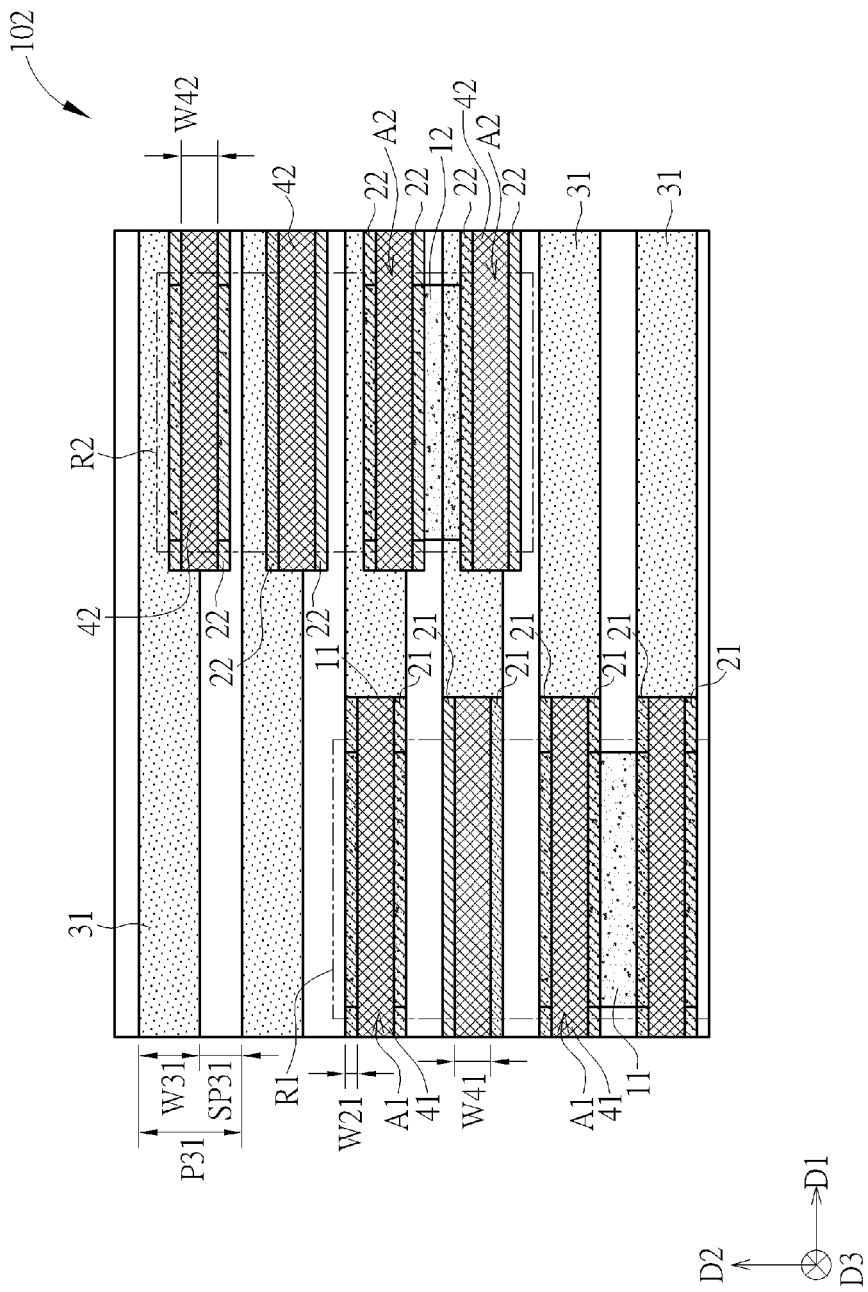
Figure 11:
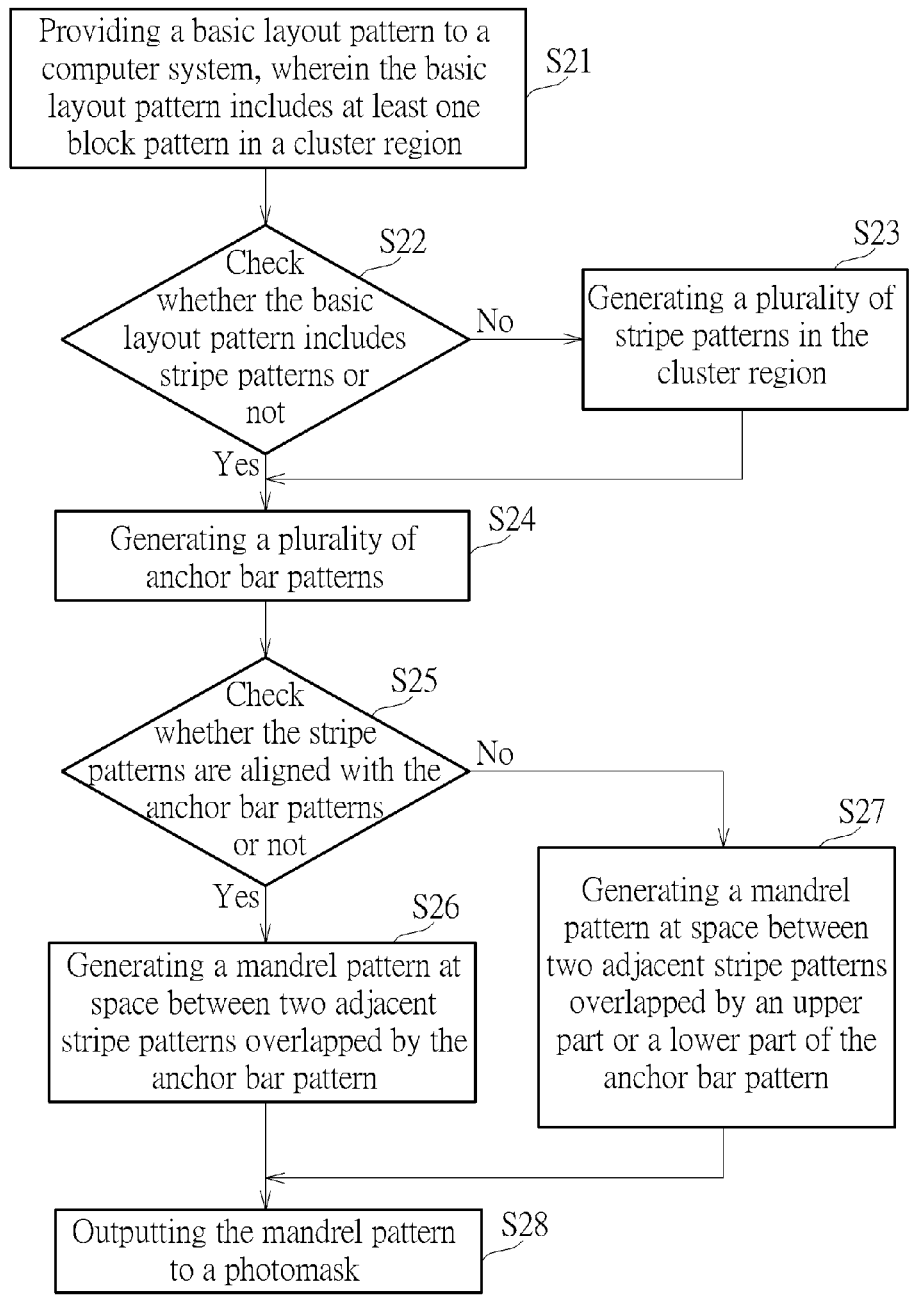
FIG. 11 is a flow chart illustrating the method for generating the layout pattern according to the third embodiment of the present invention.

Please refer to FIGS. 7-11. FIGS. 7-10 are schematic drawings illustrating a method for generating a layout pattern according to a third embodiment of the present invention. FIG. 11 is a flow chart illustrating the method for generating the layout pattern in this embodiment. The method for generating the layout pattern provided in this embodiment includes following steps. First, as shown in FIG. 7 and FIG. 11, in step S21, a basic layout pattern 102 is provided to a computer system. The basic layout pattern 102 in this embodiment includes at least one first block pattern 11 and at least one second block pattern 12. The first block pattern 11 is disposed in the first cluster region R1, and the second block pattern 12 is disposed in the second cluster region R2. The second block pattern 12 is not aligned with the first block pattern 11. In this embodiment, the basic layout pattern 102 may include a plurality of the first block patterns 11 and a plurality of the second block patterns 12 for example, but the present invention is not limited to this. In other embodiments of the present invention, the basic layout pattern 102 may only include the first block patterns 11 without other block patterns.

Figure 8:
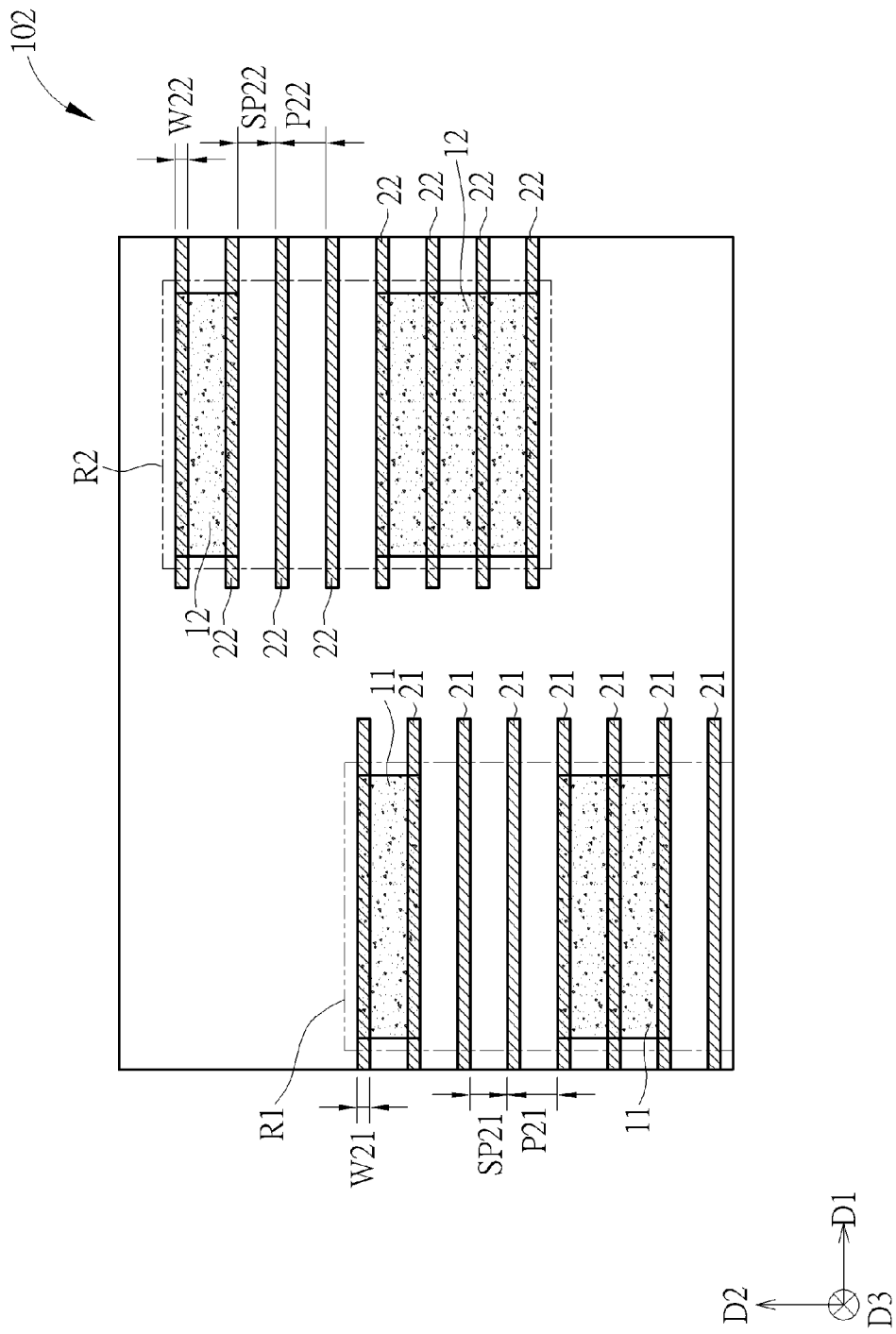

Subsequently, step S22 is performed to check whether the basic layout pattern 102 includes stripe patterns or not. Step S23 is performed before step S24 when the basic layout pattern 102 does not include stripe patterns, and the step S24 is directly performed after the step S22 when the basic layout pattern 102 includes stripe patterns. For example, as shown in FIG. 8 and FIG. 11, the step S23 is executed when the basic layout pattern 102 does not include the first stripe patterns 21 and the second stripe patterns 22 in the first embodiment mentioned above. In the step S23, a plurality of the first stripe patterns 21 are generated in the first cluster region R1, and a plurality of the second stripe patterns 22 are generated in the second cluster region R2. As shown in FIG. 7 and FIG. 8, edges of the first block pattern 11 in the second direction D2 are aligned with and partially overlap edges of two of the first stripe patterns 21 respectively, and edges of the second block pattern 12 in the second direction D2 are also aligned with and partially overlap edges of two of the second stripe patterns 22 respectively. A sixth width W11 of each of the first block patterns 11 in the second direction D2 is substantially equal to the sum of one first width W21 of the first stripe pattern 21 and an integer multiple of the first pitch P21 of the first stripe patterns 21, and a seventh width W12 of each of the second block patterns 12 in the second direction D2 is substantially equal to the sum of one second width W22 of the second stripe pattern 22 and an integer multiple of the second pitch P22 of the second stripe patterns 22. A sixth spacing SP11 between two adjacent first block patterns 11 in the second direction D2 is substantially equal to the sum of one first spacing SP21 between two adjacent first stripe patterns 21 and an integer multiple of the first pitch P21 of the first stripe patterns 21, and a seventh spacing SP12 between two adjacent second block patterns 12 in the second direction D2 is substantially equal to the sum of one second spacing SP22 between two adjacent second stripe patterns 22 and an integer multiple of the second pitch P22 of the second stripe patterns 22, but not limited thereto.

In other words, the first stripe patterns 21 and the second stripe patterns 22 are generated corresponding to the first block patterns 11 and the second block patterns 12 respectively, but the present invention is not limited to this. In other embodiment of the present invention, the basic layout pattern 102 may already include the first block patterns 11, the corresponding first stripe patterns 21, the second block patterns 12, and the corresponding second stripe patterns 22 when the basic layout pattern 102 is provided to the computer system, and the step S24 may be executed directly without performing the step S23 mentioned above. The properties of the first stripe patterns 21 and the second stripe patterns 22 are similar to those in the first embodiment mentioned above and will not be redundantly described.

As shown in FIG. 9 and FIG. 11, step S24 is then performed to generate a plurality of the anchor bar patterns 31. The step S24 in this embodiment is similar to the step S11 in the first embodiment mentioned above, and the related characteristics of the anchor bar patterns 31 are detailed in the first embodiment and will not be redundantly described. It is worth noting that at least one edge of the first block pattern 11 in the second direction D2 is aligned with and at least partially overlaps an edge of one of the anchor bar patterns 31, and the edges of the second block pattern 12 in the second direction D2 are not aligned with the edges of the anchor bar patterns 31.

As shown in FIG. 9, FIG. 10, and FIG. 11, step S25 is performed to check whether the stripe pattern are aligned with the anchor bar patterns 31 or not. Step S26 is performed when the stripe pattern are aligned with the anchor bar patterns 31, and step S27 is performed when the stripe pattern are not aligned with the anchor bar patterns 31. Step S28 is subsequently performed to output the mandrel patterns to a photomask. The step S25, the step S26, the step S27, and the step S28 in this embodiment are similar to the step S13, the step S14, the step S15, and the step S16 in the first embodiment mentioned above, and the characteristics of the first mandrel patterns 41 and the second mandrel patterns 42 are detailed in the first embodiment and will not be redundantly described. It is worth noting that the first block patterns 11 and the second block patterns 12 in this embodiment may be disposed corresponding to positions of active regions in different clusters within a semiconductor device, and the first mandrel patterns 41 and the second mandrel patterns 42 may be disposed corresponding to positions for generating fin structures and dummy fin structures in different active regions respectively, but not limited thereto. Therefore, the design end may provide a layout condition of active regions only (such as the first block patterns 11 and the second block patterns 12 in this embodiment), and the corresponding first mandrel patterns 41 and corresponding second mandrel patterns 42 may be generated by the method of generating the layout pattern in this embodiment. Corresponding first mandrel structures and corresponding second mandrel structures may be directly formed on a substrate by the photomask including the first mandrel patterns 41 and the second mandrel patterns 42 generated by the method of this embodiment, and pattern structures corresponding to the first stripe patterns 21 and the second stripe patterns 22 may then be formed on the substrate by the SIT technology and the fin cut process. The patterned structures may be used to form fin structures or gate electrodes corresponding to the active regions, but not limited thereto.

Figure 12:
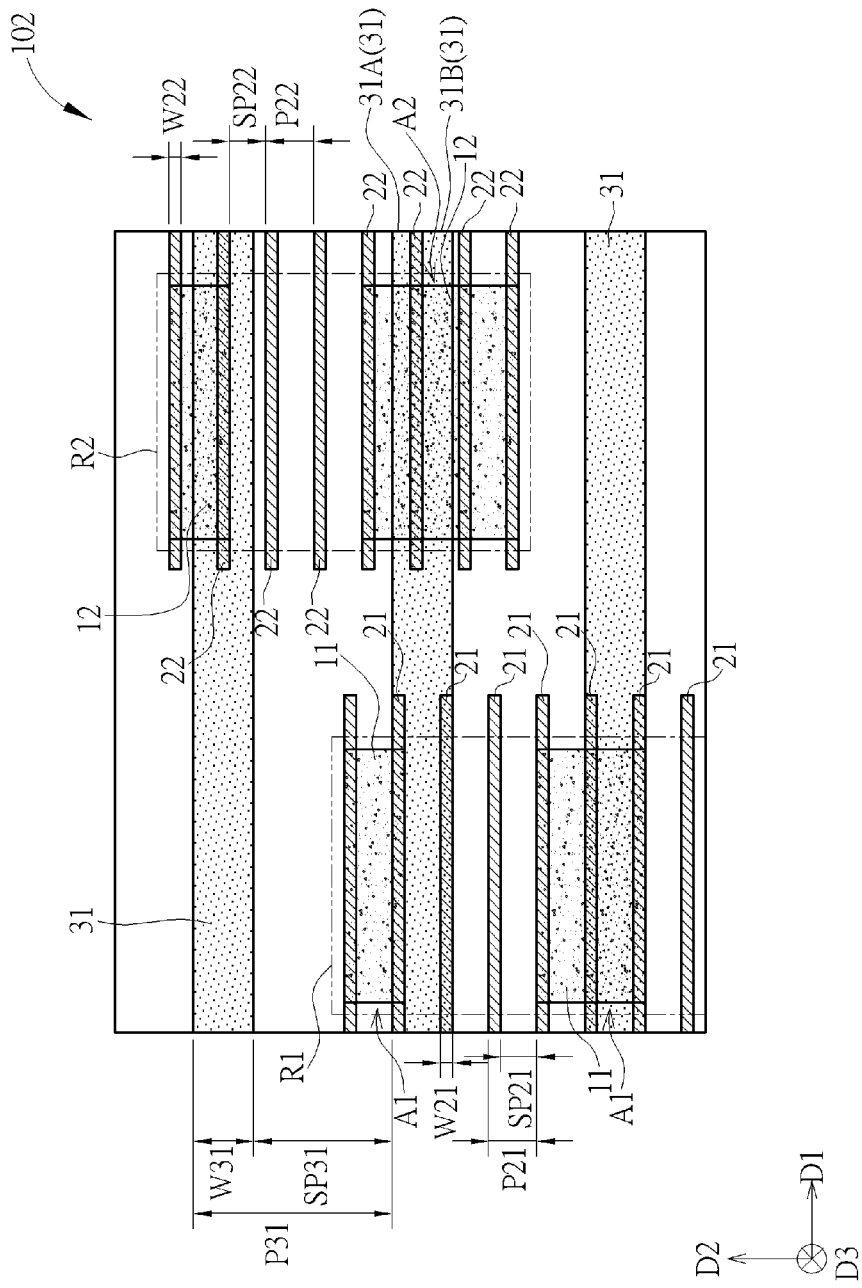
FIG. 12 and FIG. 13 are schematic drawings illustrating a method for generating a layout pattern according to a fourth embodiment of the present invention.
Figure 13:
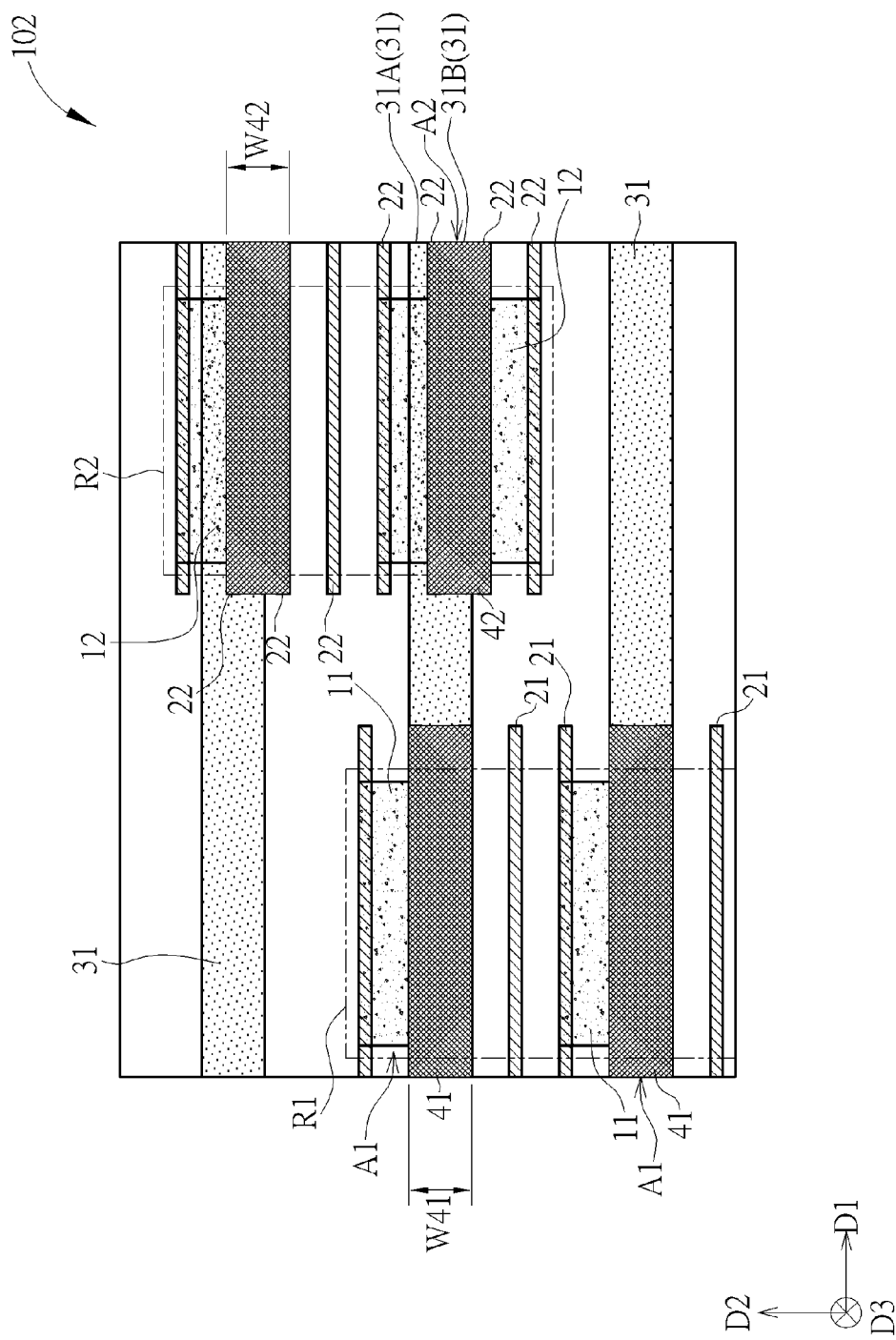

Please refer to FIG. 12 and FIG. 13. FIG. 12 and FIG. 13 are schematic drawings illustrating a method for generating a layout pattern according to a fourth embodiment of the present invention. As shown in FIG. 12 and FIG. 13, the difference between the method in this embodiment and the third embodiment mentioned above is that, in this embodiment, the third spacing SP31 between two adjacent anchor bar patterns 31 is equal to the sum of triple the first spacing SP21 between two adjacent first stripe patterns 21 and twice the first width W21 of the first stripe pattern 21. The fourth width W41 of the first mandrel pattern 41 in the second direction D2 is equal to the sum of one first pitch P21 of the first stripe patterns 21 and one first width W21 of the first stripe pattern 21, and the fifth width W42 of the second mandrel pattern 42 is substantially equal to the fourth width W41 of the first mandrel pattern 41, but not limited thereto. The method in this embodiment is similar to that in the second embodiment mentioned above. Corresponding first mandrel structures and corresponding second mandrel structures may be directly formed on a substrate by the photomask including the first mandrel patterns 41 and the second mandrel patterns 42 generated by the method of this embodiment, and pattern structures corresponding to the first stripe patterns 21 and the second stripe patterns 22 may then be formed on the substrate by a dual SIT technology and a fin cut process, but not limited thereto.

To summarize the above descriptions, according to the method for generating the layout pattern in the present invention, the position of the mandrel pattern may be decided by the overlapping conditions between the anchor bar patterns and the stripe patterns, and the stripe patterns in different cluster regions may be handled at the same time. The purposes of simplifying the calculation process and accelerating the handling speed may be achieved accordingly. In addition, the stripe patterns in the present invention may also be generated based on the block patterns representing the active regions, the design end may provide a layout condition of active regions only, and the layout loading of the design end may be reduced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for generating a layout pattern, comprising:
providing a basic layout pattern to a computer system, wherein the basic layout pattern comprises a plurality of first stripe patterns in a first cluster region, each of the first stripe patterns extends in a first direction, and the first stripe patterns have equal pitches in a second direction;
generating a plurality of anchor bar patterns, wherein each of the anchor bar patterns extends in the first direction, and the anchor bar patterns have equal pitches in the second direction, wherein edges of at least one of the anchor bar patterns in the second direction are aligned with edges of two adjacent first stripe patterns respectively, and at least one of the anchor bar patterns overlaps a first space between two adjacent first stripe patterns;
generating a first mandrel pattern at the first space overlapped by the anchor bar pattern; and
forming a photomask, wherein the first mandrel pattern is outputted to the photomask.

2. The method for generating the layout pattern according to claim 1, wherein a width of each of the anchor bar patterns is equal to the sum of twice the width of the first stripe pattern and one spacing between two adjacent first stripe patterns.

3. The method for generating the layout pattern according to claim 1, wherein spacing between two adjacent anchor bar patterns is equal to spacing between two adjacent first stripe patterns.

4. The method for generating the layout pattern according to claim 1, wherein spacing between two adjacent anchor bar patterns is equal to the sum of triple the spacing between two adjacent first stripe patterns and twice the width of the first stripe pattern.

5. The method for generating the layout pattern according to claim 1, wherein a width of the first mandrel pattern in the second direction is equal to spacing between two adjacent first stripe patterns.

6. The method for generating the layout pattern according to claim 1, wherein a width of the first mandrel pattern in the second direction is equal to the sum of one pitch of the first stripe patterns and one width of the first stripe pattern.

7. The method for generating the layout pattern according to claim 1, wherein the basic layout pattern further comprises at least one first block pattern in the first cluster region, and edges of the first block pattern in the second direction are aligned with edges of two of the first stripe patterns respectively.

8. The method for generating the layout pattern according to claim 7, wherein the basic layout pattern comprises a plurality of the first block patterns in the first cluster region, and spacing between two adjacent first block patterns in the second direction is equal to the sum of one spacing between two adjacent first stripe patterns and an integer multiple of the pitch of the first stripe patterns.

9. The method for generating the layout pattern according to claim 7, wherein a width of the first block pattern in the second direction is equal to the sum of one width of the first stripe pattern and an integer multiple of the pitch of the first stripe patterns.

10. The method for generating the layout pattern according to claim 1, wherein the basic layout pattern further comprises a plurality of second stripe patterns in a second cluster region, each of the second stripe patterns extends in the first direction, the second stripe patterns have equal pitches in the second direction, and the second stripe patterns are not aligned with the first stripe patterns.

11. The method for generating the layout pattern according to claim 10, wherein at least one of the anchor bar patterns overlaps a second space between two adjacent second stripe patterns.

12. The method for generating the layout pattern according to claim 11, further comprising:
generating a second mandrel pattern at the second space overlapped by the anchor bar pattern, wherein the second space overlaps an upper portion or a lower portion of the anchor bar pattern; and
outputting the second mandrel pattern to the photomask.

13. The method for generating the layout pattern according to claim 12, wherein a width of the first mandrel pattern is equal to a width of the second mandrel pattern.

14. The method for generating the layout pattern according to claim 10, wherein spacing between two adjacent first stripe patterns is equal to spacing between two adjacent second stripe patterns.

15. The method for generating the layout pattern according to claim 14, wherein a width of each of the first stripe patterns is equal to a width of each of the second stripe patterns.

16. The method for generating the layout pattern according to claim 10, wherein the basic layout pattern further comprises at least one second block pattern in the second cluster region, edges of the second block pattern in the second direction are aligned with edges of two of the second stripe patterns respectively, and the edges of the second block pattern in the second direction are not aligned with the anchor bar patterns.

17. The method for generating the layout pattern according to claim 10, wherein the first cluster region is separated from the second cluster region.

18. The method for generating the layout pattern according to claim 1, wherein the first direction is perpendicular to the second direction.

* * * * *